(12) United States Patent
Koshy

(10) Patent No.: US 9,028,918 B2
(45) Date of Patent: May 12, 2015

(54) FORMING A HARDMASK CAPPING LAYER

(75) Inventor: Robin Abraham Koshy, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 184 days.

(21) Appl. No.: 13/590,556

(22) Filed: Aug. 21, 2012

(65) Prior Publication Data

US 2014/0057099 A1    Feb. 27, 2014

(51) Int. Cl.
| | |
|---|---|
| *C23C 16/30* | (2006.01) |
| *B32B 5/00* | (2006.01) |
| *B32B 9/04* | (2006.01) |
| *H01L 21/033* | (2006.01) |
| *H01L 21/308* | (2006.01) |
| *H01L 21/311* | (2006.01) |
| *C23C 28/04* | (2006.01) |
| *C23C 28/00* | (2006.01) |
| *B82Y 30/00* | (2011.01) |
| *B82Y 40/00* | (2011.01) |

(52) U.S. Cl.
CPC .............. *B32B 5/00* (2013.01); *Y10T 428/265* (2015.01); *B32B 9/04* (2013.01); *B82Y 30/00* (2013.01); *B82Y 40/00* (2013.01); *H01L 21/0332* (2013.01); *H01L 21/3081* (2013.01); *H01L 21/31144* (2013.01); *C23C 28/04* (2013.01); *C23C 28/042* (2013.01); *C23C 28/42* (2013.01)

(58) Field of Classification Search
CPC .......... B32B 9/04; B82Y 30/00; B82Y 40/00; C23C 16/325; C23C 16/342
USPC ......................................... 427/96.2, 96.4, 96.8
See application file for complete search history.

(56) References Cited

U.S. PATENT DOCUMENTS

| | | | |
|---|---|---|---|
| 8,211,510 B1 * | 7/2012 | Varadarajan et al. .......... | 427/558 |
| 2001/0012689 A1 * | 8/2001 | Okoroanyanwu et al. .... | 438/637 |
| 2006/0157684 A1 * | 7/2006 | Decker ........................... | 257/13 |
| 2006/0269847 A1 * | 11/2006 | Holmes et al. ................. | 430/5 |
| 2008/0299494 A1 * | 12/2008 | Bencher et al. ................ | 430/313 |
| 2009/0103069 A1 * | 4/2009 | Jonckheere et al. ............ | 355/67 |
| 2010/0093172 A1 * | 4/2010 | Kim et al. ...................... | 438/689 |
| 2011/0275218 A1 * | 11/2011 | Liang et al. .................... | 438/702 |

FOREIGN PATENT DOCUMENTS

WO    WO 2007/116362    * 10/2007

OTHER PUBLICATIONS

Kim, Tae Geun, et al., "Characterization of Ru layer for capping/buffer application in EUVL mask". Microelectronic Engineering 83 (2006) 688-691.*
Lee, Sang-Ho, et al., "Particle Adhesion and Removal on EUV Mask Layers During Wet Cleaning". Japanese Journal of Applied Physics, vol. 44, No. 7B, 2005, pp. 5479-5483.*
Lee, Jae-Young, et al., "Coating BaTiO3 Nanolayers on Spherical Ni Powders for Multilayers Ceramic Capacitors". Advanced Materials 2003, 15, No. 19, Oct. 2, pp. 1655-1658.*
Tsarfati, Tim, et al., "Growth and sacrificial oxidation of transition metal nanolayers". Surface Science 603 (2009) 1041-1045.*

* cited by examiner

*Primary Examiner* — Bret Chen
(74) *Attorney, Agent, or Firm* — Ditthavong & Steiner, P.C.

(57) ABSTRACT

A capping layer is formed over a hardmask layer to increase the etch resistance and overall performance of the hardmask layer. Embodiments include forming a hardmask layer over a substrate and forming a capping layer on the hardmask layer, the capping layer including a stack of at least two nanolayers.

5 Claims, 4 Drawing Sheets

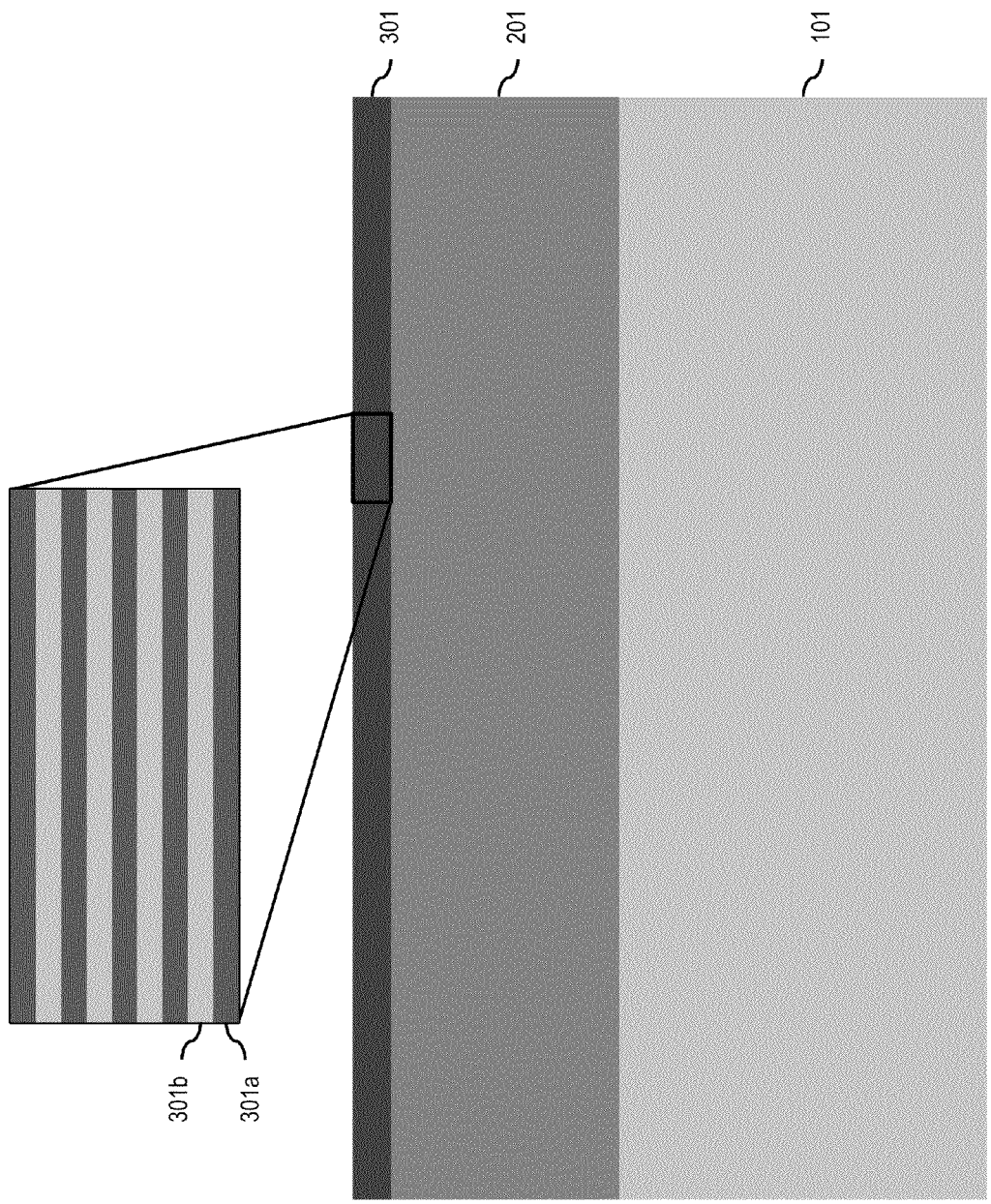

FORMING A HARDMASK CAPPING LAYER

TECHNICAL FIELD

The present disclosure relates to hardmask layers. The present disclosure is particularly applicable to hardmask layers with capping layers for increased etch resistance.

BACKGROUND

Hardmasks are employed as etch masks for a variety of semiconductor manufacturing processes. Titanium nitride (TiN) hardmasks have been used, for example, for forming self-aligned vertical interconnect accesses (VIAs) (the simultaneous formation of a first layer metal and upper layer metal pattern and level (V0 and others) VIAs). However, TiN hardmask layers have poor etch resistance. The poor etch resistance prevents the hardmask layers from being used in processes related to, for example, trench first metal hardmask schemes, hardmask open schemes, and VIA double patterning schemes. Current conventional hardmask layers are also plagued by poor self-aligned VIA (SAV) performance as part of a dielectric etch. A marginal increase in the etch resistance of the hardmask layer will allow for critical functions like merged VIAs to be used with respect to new technology nodes. Merged VIAs will allow designers to fit more VIAs into a fixed space with no upgrade in lithography tool sets.

A need therefore exists for methodology enabling formation of hardmask layers with increased etch resistance and hardmask layer performance, and the resulting device.

SUMMARY

An aspect of the present disclosure is an efficient method for forming a capping layer of nanolayers on a hardmask layer.

Another aspect of the present disclosure is a hardmask layer having a capping layer of nanolayers thereon.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a hardmask layer over a substrate, and forming a capping layer on the hardmask layer, the capping layer including a stack of at least two nanolayers.

Aspects of the present disclosure include forming the capping layer and the hardmask layer to a total thickness of less than or equal to 40 nanometers (nm). An additional aspect includes forming the capping layer and the hardmask layer to a total thickness of 30 to 40 nm. Another aspect includes forming the capping layer to a thickness of 10 to 30 nm. Another aspect includes the capping layer being formed of nanolayers of silicon carbide (SiC), cubic boron nitride (c-BN), or turbostatic boron nitride (t-BN), or alternating nanolayers of SiC and silicon carbon nitride (SiCN), BN and TiN, or SiC and BN.

Another aspect of the present disclosure is a device including: a substrate, a hardmask layer over the substrate, and a capping layer on the hardmask layer, the capping layer including a stack of at least two nanolayers.

Aspects include a thickness of the capping layer and the hardmask layer being less than 40 nm. Another aspect includes a thickness of the capping layer and the hardmask layer being 30 to 40 nm. A further aspect includes a thickness of the capping layer being 10 to 30 nm. Yet another aspect includes the capping layer including nanolayers of SiC, c-BN, or t-BN, or alternating nanolayers of SiC and SiCN, BN and TiN, or SiC and BN.

Another aspect of the present disclosure includes: forming a TiN hardmask layer over a substrate, and forming a capping layer of at least two nanolayers on the TiN hardmask layer to a thickness of 10 to 30 nm, wherein a total thickness of the TiN hardmask layer and the capping layer ranges from 30 to 40 nm.

Another aspect includes the capping layer formed of nanolayers of SiC or t-BN, or alternating nanolayers of SiC and SiCN, BN and TiN, or SiC and BN.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 1 through 4 schematically illustrate a method for forming a capping layer on a hardmask layer, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of poor etch resistance attendant upon etching through conventional hardmask layers. In accordance with embodiments of the present disclosure, a capping layer is formed over the hardmask layer to increase the overall performance of the hardmask layer with respect to etch resistance.

Methodology in accordance with embodiments of the present disclosure includes forming a hardmask layer over a substrate, and forming a capping layer on the hardmask layer, the capping layer including a stack of at least two nanolayers. The capping layer may include nanolayers of SiC, c-BN, or t-BN, or alternating nanolayers of SiC and SiCN, BN and TiN, or SiC and BN.

Figure 1:
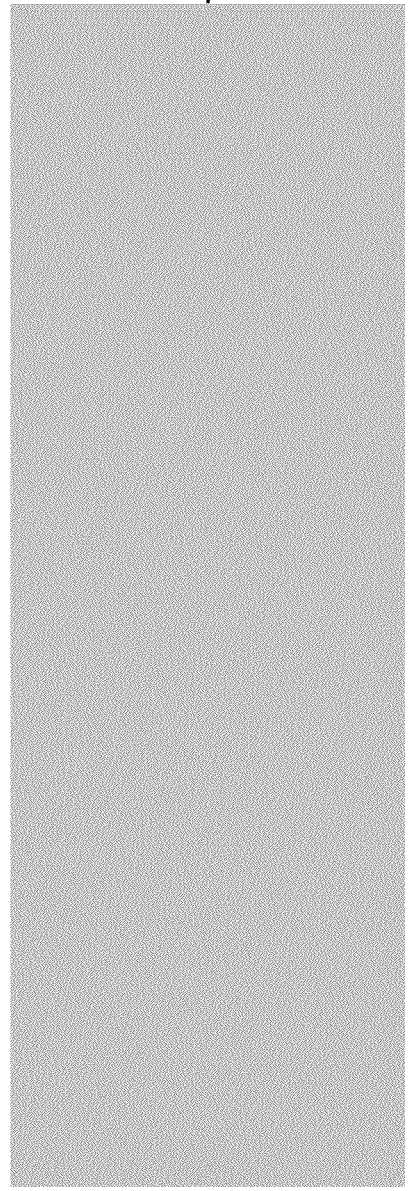

Adverting to FIG. 1, a method of forming a capping layer over a hardmask layer, in accordance with an exemplary embodiment, begins with a base layer 101. The base layer 101 may be any type of layer that may subsequently have a hardmask layer deposited on it or over it, such as an interlayer dielectric (ILD) or substrate in manufacturing a semiconductor device.

Figure 2:
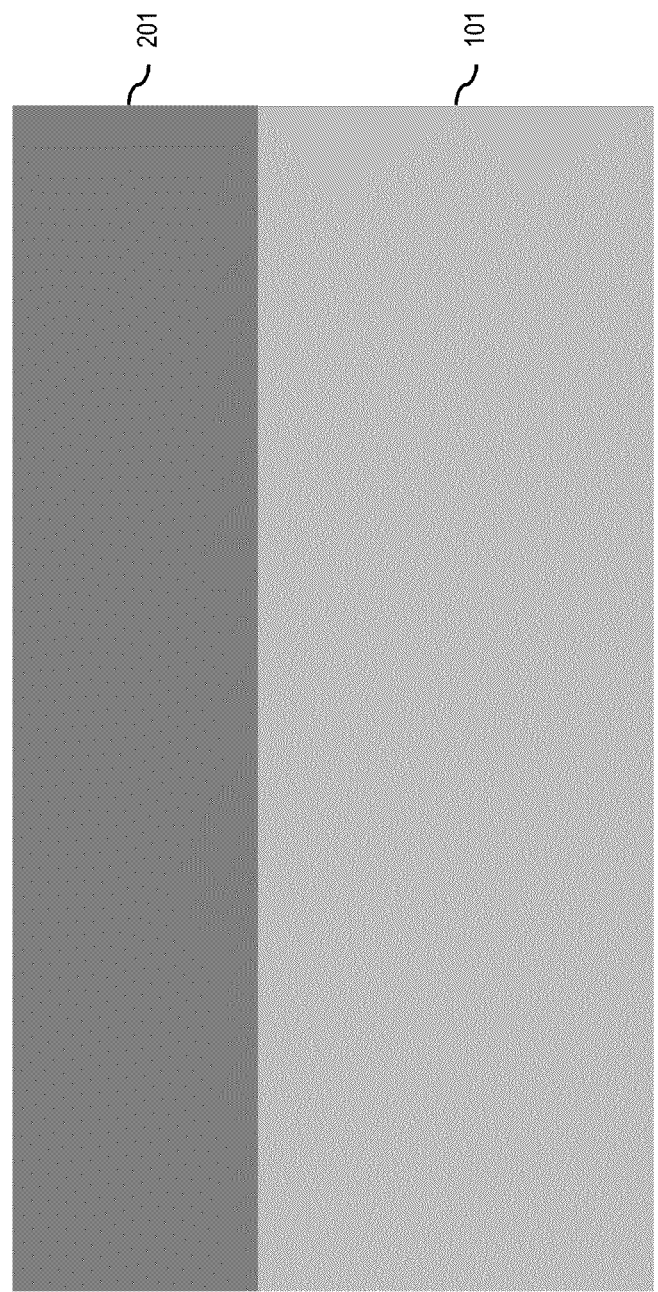

Next, a hardmask layer 201 may be formed over the base layer 101, as illustrated in FIG. 2. The hardmask layer 201 may be formed directly on the base layer 101, or may be formed on one or more additional layers between the hardmask layer 201 and the base layer 101, depending on the specifics of the process. The hardmask layer 201 may be formed of TiN. An additional hardmask layer of tetraethyl orthosilicate (TEOS) (not shown for illustrative convenience) may be included beneath the hardmask layer 201.

Figure 3:
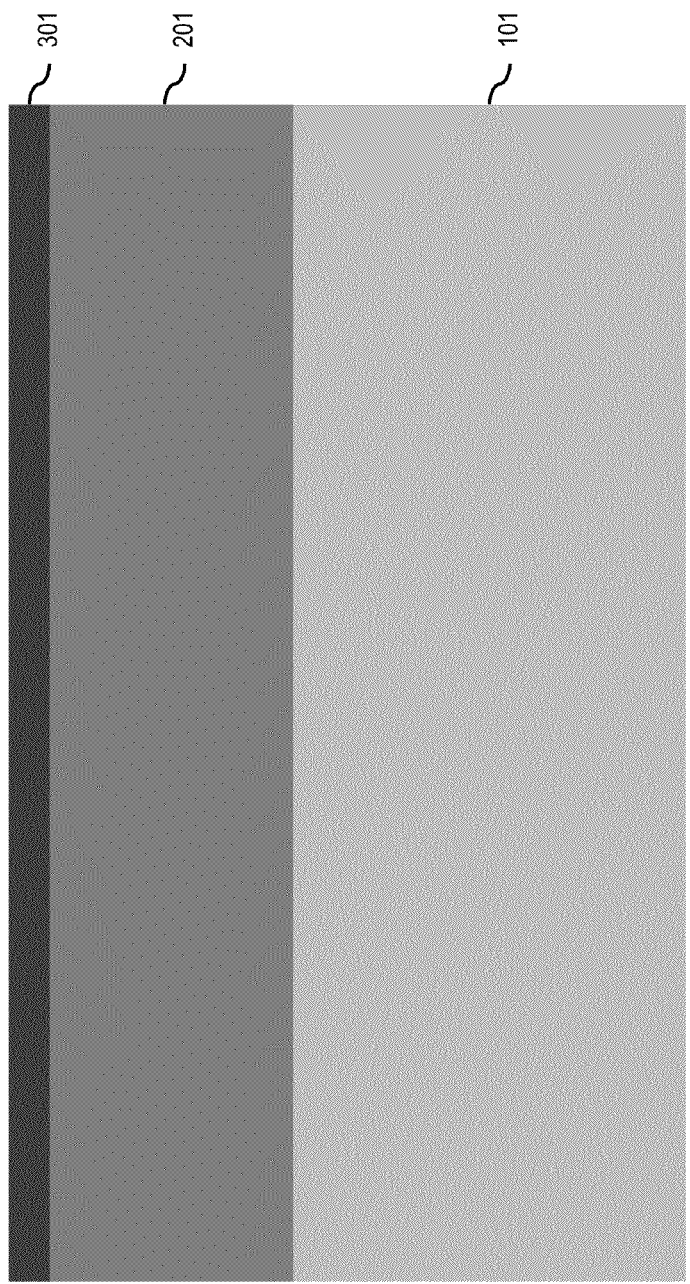

Adverting to FIG. 3, a capping layer 301 may be formed on the hardmask layer 201. The capping layer 301 may be formed to a thickness of 10 to 30 nm and may be formed via deposition. The combination of the capping layer 301 and the hardmask layer 201 may be formed to a thickness of less than or equal to 40 nm, such as 30 to 40 nm, as thicker hardmask and capping layers would undesirably increase the aspect ratio during later etching.

Further, as illustrated in FIG. 4, the capping layer 301 may be formed of at least two nanolayers 301a and 301b. The nanolayers 301a and 301b may be repeating nanolayers of only SiC, c-BN, t-BN, or a combination thereof. A capping layer of SiC may act as an etch stop layer over the TiN hardmask. Alternatively, the nanolayers 301a and 301b may include alternating nanolayers of SiC and SiCN, BN and TiN, or SiC and BN. SiC is harder than TiN, and, therefore, is a desirable capping material for the TiN. Further, the higher the carbon content, the better the capping layer acts as an NBlok layer. However, when SiC is one of two alternating nanolayers, the SiC should be nanolayer 301b, separated from the TiN hardmask layer, as SiC tends to delaminate from TiN. For example, the nanolayer 301a may be SiCN and the nanolayer 301b may be SiC, and the nanolayers 301a and 301b may repeat to form a capping layer 301. Each one of the nanolayers 301a and 301b may be formed to a thickness of 0.5 to 10 nm, and the capping layer 301 may be formed to have 2 to 100 interfaces of the nanolayers 301a and 301b. By maximizing the number of nanolayers 301a and 301b (thereby increasing the number of interfaces) while minimizing the thickness of each nanolayer such that the thickness of the capping layer 301 remains constant, harder capping layers may be formed without increasing the residual stress. Rather, the residual stress is mitigated by the presence of the interfaces, which are believed to act as buffers and reduce the overall residual stress of the capping layer 301 leading to a capping layer 301 with a lower residual stress than any single nanolayer 301a or 301b that forms the capping layer 301.

The embodiments of the present disclosure achieve several technical effects, including improved etch resistance and increased the overall performance of a hardmask layer, thereby allowing the hardmask layer to be used in trench first metal hardmask schemes and double pattern VIA schemes. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a hardmask layer over a substrate; and
   forming a capping layer on the hardmask layer, wherein:
      the capping layer comprises a stack of either: at least three alternation nanolayers of silicon carbide (SiC) and silicon carbon nitride (SiCN), at least three alternating nanolayers of boron nitride (BN) and titanium nitride (TiN), or at least three alternating nanolayers of SiC and BN.

2. A method according to claim 1, comprising forming the capping layer and the hardmask layer to a total thickness of less than or equal to 40 nanometers (nm).

3. A method according to claim 2, comprising forming the capping layer and the hardmask layer to a total thickness of 30 to 40 nm.

4. A method according to claim 1, comprising forming the capping layer to a thickness of 10 to 30 nm, wherein the stack includes 100 nanolayers.

5. A method comprising:
   forming a titanium nitride (TiN) hardmask layer over a substrate; and
   forming a capping layer on the TiN hardmask layer to a thickness of 10 to 30 nm, wherein:
   a total thickness of the TiN hardmask layer and the capping layer ranges from 30 to 40 nm, and
   the capping layer comprises a stack of either: at least 20 alternating nanolayers of silicon carbide (SiC) and silicon carbon nitride (SiCN), at least 20 alternating nanolayers of boron nitride (BN) and titanium nitride (TiN), or at least 20 alternating nanolayers of SiC and BN.

* * * * *